United States Patent
Tseng et al.

(10) Patent No.: US 12,309,968 B2
(45) Date of Patent: May 20, 2025

(54) COLD PLATE MODULE

(71) Applicant: ACCTON TECHNOLOGY CORPORATION, Hsinchu (TW)

(72) Inventors: Yu Ting Tseng, Chiayi County (TW); Jih-Che Yeh, New Taipei (TW)

(73) Assignee: ACCTON TECHNOLOGY CORPORATION, Hsinchu (TW)

( * ) Notice: Subject to any disclaimer, the term of this patent is extended or adjusted under 35 U.S.C. 154(b) by 327 days.

(21) Appl. No.: 18/188,447

(22) Filed: Mar. 22, 2023

(65) Prior Publication Data
US 2023/0328922 A1 Oct. 12, 2023

(30) Foreign Application Priority Data
Apr. 12, 2022 (TW) .................. 111203673

(51) Int. Cl.
*H05K 7/20* (2006.01)
*G06F 1/20* (2006.01)

(52) U.S. Cl.
CPC .......... *H05K 7/20254* (2013.01); *G06F 1/20* (2013.01); *H05K 7/20327* (2013.01); *F28F 2265/16* (2013.01); *G06F 2200/201* (2013.01)

(58) Field of Classification Search
CPC .......... H05K 7/20254; H05K 7/20763; H05K 7/20218; H05K 7/20272; H05K 7/20327; H05K 7/2029; H05K 7/208; G06F 2200/201; G06F 1/20; H01L 23/473; F28F 2265/16; F28F 2265/00
See application file for complete search history.

(56) References Cited

U.S. PATENT DOCUMENTS

| | | | |
|---|---|---|---|
| 11,725,886 B2* | 8/2023 | Mostafavi Yazdi | F28F 9/0246 165/80.4 |
| 12,188,733 B2* | 1/2025 | Mostafavi Yazdi | F28F 9/0246 |
| 2014/0071616 A1* | 3/2014 | Watanabe | H05K 7/20772 361/679.47 |
| 2017/0181328 A1* | 6/2017 | Shelnutt | G06F 1/20 |
| 2019/0145639 A1* | 5/2019 | Allen | F28D 21/0015 62/94 |
| 2019/0223324 A1* | 7/2019 | Le | H05K 7/20263 |
| 2020/0340767 A1* | 10/2020 | Holden | H05K 7/20254 |
| 2021/0216121 A1* | 7/2021 | Weldon | G06F 1/203 |

* cited by examiner

*Primary Examiner* — Adam B Dravininkas
(74) *Attorney, Agent, or Firm* — CKC & Partners Co., LLC

(57) ABSTRACT

A cold plate module includes a cold plate, a structural piece, a frame and an absorbing element. The cold plate includes a body, an inlet and an outlet. The body has a first and a second surfaces. The first surface abuts a heat source on a motherboard. The inlet and the outlet communicate with the body. The structural piece has a third and a fourth surfaces. The third surface connects the second surface. The structural piece connects the motherboard. The frame connects and defines a space with the fourth surface. The inlet and the outlet locate within the space. The absorbing element connects the fourth surface within the space. The inlet and the outlet penetrate through the structural piece and the absorbing element. The absorbing element locates between the fourth surface and both of an entrance of the inlet and an exit of the outlet.

16 Claims, 10 Drawing Sheets

B-B

COLD PLATE MODULE

RELATED APPLICATIONS

This application claims priority to Taiwanese Application Serial Number 111203673 filed Apr. 12, 2022, which is herein incorporated by reference.

BACKGROUND

Technical Field

The present disclosure relates to cold plate modules.

Description of Related Art

With the improvement of living qualities nowadays, the demand of people for computer equipment has also been increasing. Correspondingly, in order to fulfill the increasing demand of consumers, the manufacturers have been working hard to improve the computer equipment.

In general, with regards to the enhancement of efficacy of computer equipment, a cooling system has become a common measure of heat dissipation. In order to increase the effect of heat dissipation, manufacturers often use cooling liquid as a circulated medium in the cooling system, so as to deliver away the heat inside the computer equipment. However, in case there is a poor connection of the cooling system upon different conditions, cooling liquid may probably leak out of the cooling system, which may cause problem of damage of other electronic components or circuits in the computer equipment.

Therefore, the approach to avoid damage of electronic components or circuits due to leakage of cooling liquid is undoubtedly an important issue which the industry highly concerns.

SUMMARY

A technical aspect of the present disclosure is to provide a cold plate module, which can avoid cooling liquid leaked out from the connections of ducts from flowing or splashing to other electronic components, which may then cause damage to these electronic components.

According to an embodiment of the present disclosure, a cold plate module includes a cold plate, a structural piece, a frame and an absorbing element. The cold plate includes a main body, an inlet port and an outlet port. The main body has a first surface and a second surface opposite to the first surface. The first surface is configured to abut against a heat source. The heat source is disposed on a motherboard. The inlet port is connected with the second surface and is communicated with the main body. The inlet port has an entrance. The entrance is configured to allow a cooling liquid to flow into the main body. The outlet port is connected with the second surface and is communicated with the main body. The outlet port has an exit. The exit is configured to allow the cooling liquid to flow away from the main body. The structural piece has a third surface and a fourth surface opposite to the third surface. The third surface is configured to connect with the second surface. The structural piece is configured to connect with the motherboard. The frame is connected with the fourth surface. The frame defines an accommodation space together with the fourth surface. The inlet port and the outlet port are at least partially located within the accommodation space. The absorbing element is connected with the fourth surface and is disposed within the accommodation space. The inlet port and the outlet port at least partially penetrate through the structural piece and the absorbing element. The absorbing element is at least partially located between the fourth surface and both of the entrance and the exit.

In one or more embodiments of the present disclosure, the frame has an inner wall forming a complete enclosure.

In one or more embodiments of the present disclosure, the absorbing element at least partially abuts against the inner wall.

In one or more embodiments of the present disclosure, the absorbing element at least partially abuts against the inlet port and the outlet port.

In one or more embodiments of the present disclosure, the structural piece and the frame are integrally-formed.

In one or more embodiments of the present disclosure, the absorbing element is a sponge.

In one or more embodiments of the present disclosure, the inlet port is configured to be at least partially sleeved by a duct such that the entrance is located inside the duct.

In one or more embodiments of the present disclosure, the outlet port is configured to be at least partially sleeved by a duct such that the exit is located inside the duct.

According to an embodiment of the present disclosure, a cold plate module includes a cold plate, a frame and an absorbing element. The cold plate includes a main body, a structural plate, an inlet port and an outlet port. The main body has a side surface, a first surface and a second surface. The first surface and the second surface are opposite to each other. The side surface is connected between the first surface and the second surface. The first surface is configured to abut against a heat source. The heat source is disposed on a motherboard. The structural plate is connected with the side surface. The structural plate has a third surface and a fourth surface opposite to the third surface. The third surface is coplanar with the first surface. The structural plate is configured to connect with the motherboard. The inlet port is connected with the side surface and is communicated with the main body. The inlet port has an entrance. The entrance is configured to allow a cooling liquid to flow into the main body. The outlet port is connected with the side surface and is communicated with the main body. The outlet port has an exit. The exit is configured to allow the cooling liquid to flow away from the main body. The frame is connected with the fourth surface. The frame defines an accommodation space together with the fourth surface. The side surface, the inlet port and the outlet port are at least partially located within the accommodation space. The absorbing element is connected with the fourth surface and is disposed within the accommodation space. The main body at least partially penetrates through the absorbing element. The absorbing element is at least partially located between the fourth surface and both of the entrance and the exit.

In one or more embodiments of the present disclosure, the frame has an inner wall forming a complete enclosure.

In one or more embodiments of the present disclosure, the absorbing element at least partially abuts against the inner wall.

In one or more embodiments of the present disclosure, the absorbing element at least partially abuts against the side surface.

In one or more embodiments of the present disclosure, the structural plate and the frame are integrally-formed.

In one or more embodiments of the present disclosure, the absorbing element is a sponge.

In one or more embodiments of the present disclosure, the inlet port is configured to be at least partially sleeved by a duct such that the entrance is located inside the duct.

In one or more embodiments of the present disclosure, the outlet port is configured to be at least partially sleeved by a duct such that the exit is located inside the duct.

The above-mentioned embodiments of the present disclosure have at least the following advantages:

(1) Since the absorbing element is at least partially located between the fourth surface of the structural piece or the structural plate and both of the entrance of the inlet port and the exit of the outlet port, even if leakage occurs at the connections of the ducts with the entrance or the exit due to poor connection, the cooling liquid leaked out can be easily absorbed by the absorbing element, such that the cooling liquid leaked out can be avoided from flowing or splashing to other electronic components on the motherboard, which may cause damage to these electronic components.

(2) Since the inner wall of the frame forms a complete enclosure, even if the absorbing element is saturated after absorbing plenty of cooling liquid leaked out and is not able to further absorb any cooling liquid, the excessive cooling liquid will be blocked by the frame and will not easily flow out of the frame, which provides a further protection to the other electronic components on the motherboard.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
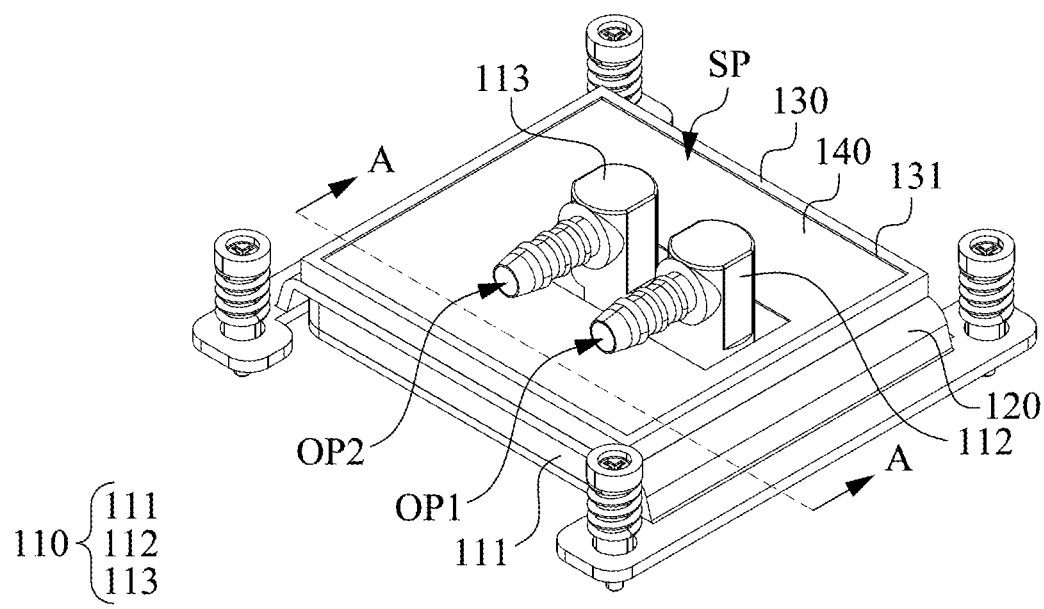
FIG. 1 is a schematic view of a cold plate module according to an embodiment of the present disclosure.

Drawings will be used below to disclose embodiments of the present disclosure. For the sake of clear illustration, many practical details will be explained together in the description below. However, it is appreciated that the practical details should not be used to limit the claimed scope. In other words, in some embodiments of the present disclosure, the practical details are not essential. Moreover, for the sake of drawing simplification, some customary structures and elements in the drawings will be schematically shown in a simplified way. Wherever possible, the same reference numbers are used in the drawings and the description to refer to the same or like parts.

Unless otherwise defined, all terms (including technical and scientific terms) used herein have the same meanings as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
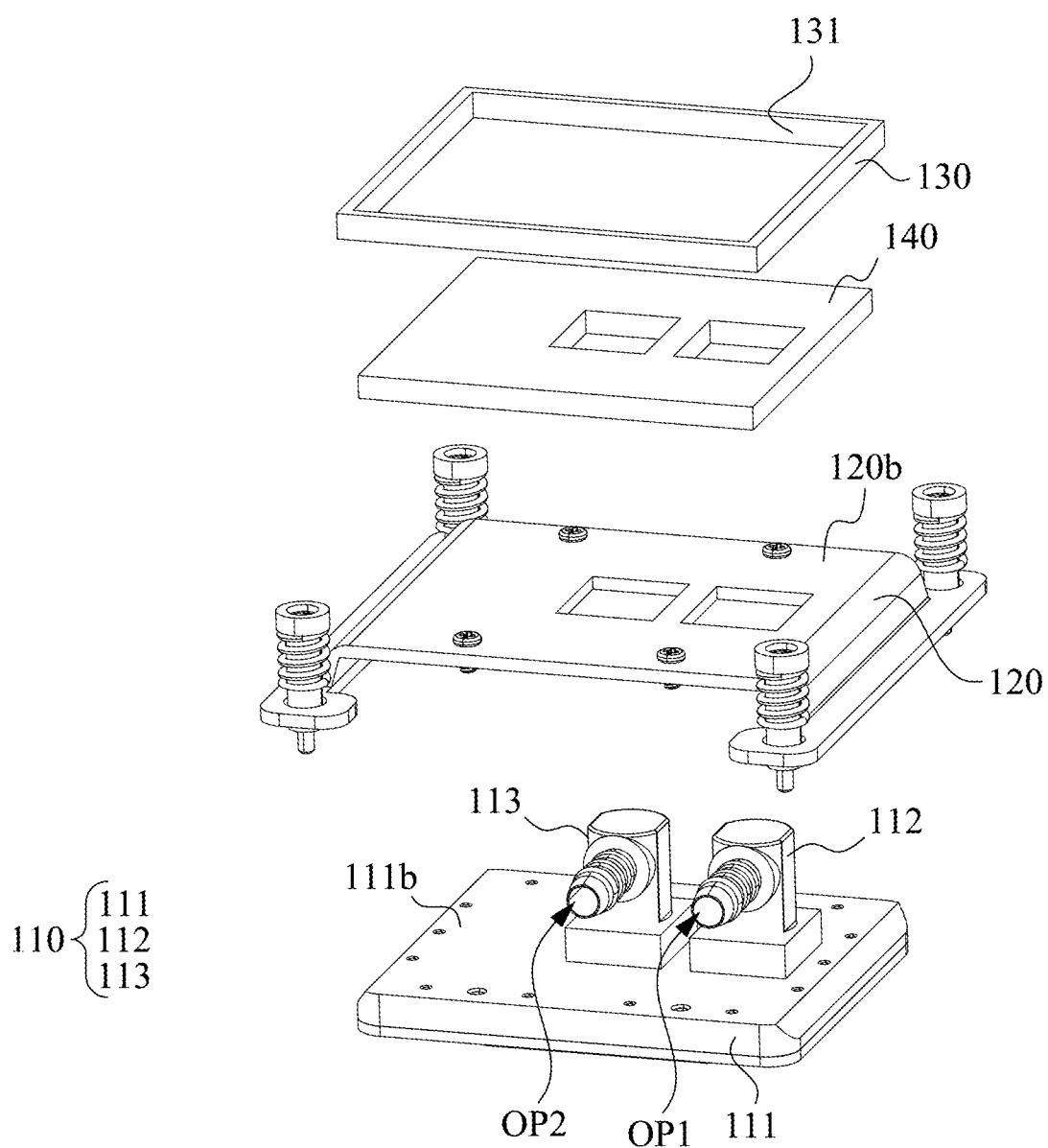
FIG. 2 is an exploded view of the cold plate module of FIG. 1.

Reference is made to FIGS. 1-2. FIG. 1 is a schematic view of a cold plate module 100 according to an embodiment of the present disclosure. FIG. 2 is an exploded view of the cold plate module 100 of FIG. 1. In this embodiment, as shown in FIGS. 1-2, a cold plate module 100 includes a cold plate 110, a structural piece 120, a frame 130 and an absorbing element 140. The cold plate 110 includes a main body 111, an inlet port 112 and an outlet port 113. The main body 111 has a first surface 111a (please see FIG. 3) and a second surface 111b opposite to the first surface 111a. The inlet port 112 is connected with the second surface 111b and is communicated with the main body 111. The inlet port 112 has an entrance OP1. The entrance OP1 is configured to allow a cooling liquid to flow into the main body 111. The outlet port 113 is connected with the second surface 111b and is communicated with the main body 111. The outlet port 113 has an exit OP2. The exit OP2 is configured to allow the cooling liquid to flow away from the main body 111. The structural piece 120 has a third surface 120a (please see FIG. 3) and a fourth surface 120b opposite to the third surface 120a. The third surface 120a of the structural piece 120 is configured to abut against and connect with the second surface 111b of the main body 111. The frame 130 is connected with the fourth surface 120b of the structural piece 120. The frame 130 defines an accommodation space SP together with the fourth surface 120b. For example, the connection between the frame 130 and the structural piece 120 can be achieved by welding. However, this does not intend to limit the present disclosure. The absorbing element 140 is connected with the fourth surface 120b of the structural piece 120 and is disposed within the accommodation space SP.

Figure 3:
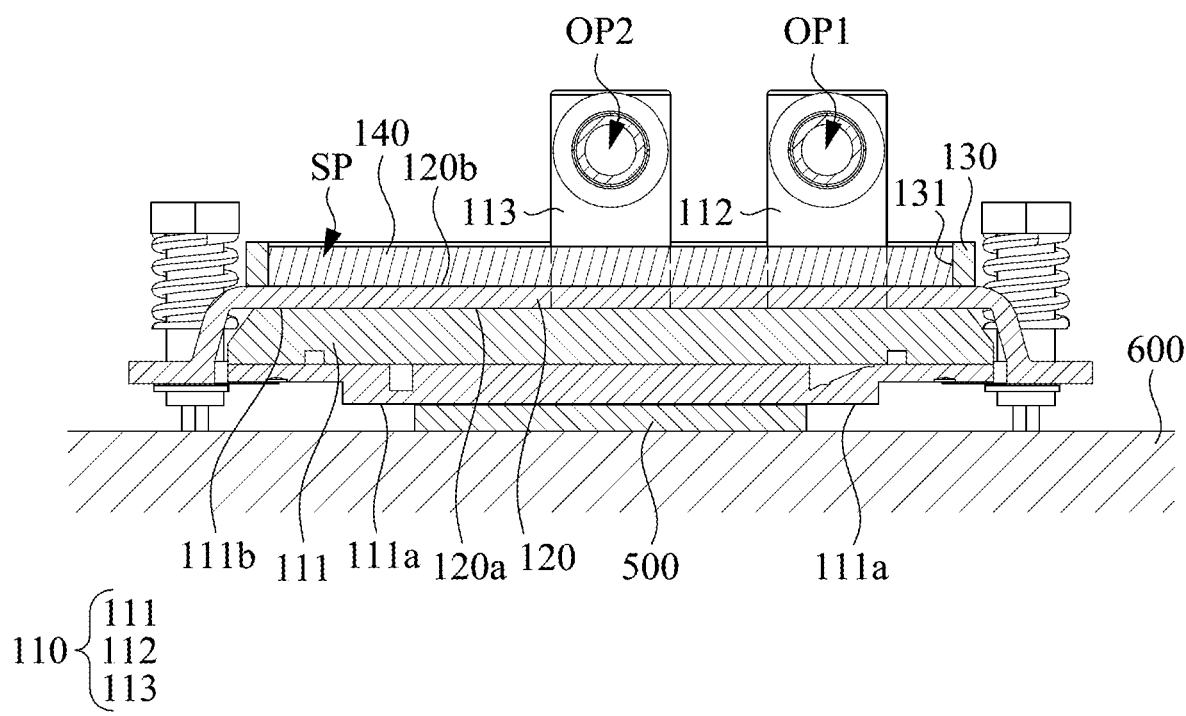
FIG. 3 is a cross-sectional view along the sectional line A-A of FIG. 1.

Reference is made to FIG. 3 together with FIGS. 1-2. FIG. 3 is a cross-sectional view along the sectional line A-A of FIG. 1. In this embodiment, as shown in FIGS. 1-3, the first surface 111a of the main body 111 is configured to abut against a heat source 500, such that the cold plate 110 can deliver any heat of the heat source 500 away, in order to carry out heat dissipation to the heat source 500. For example, the heat source 500 can be a chip or a die, which is disposed on a motherboard 600 of an electronic device. For example, the motherboard 600 can be an application specific integrated circuit (ASIC) board. However, this does not intend to limit the present disclosure. For the sake of drawing simplification, the heat source 500 and the motherboard 600 are not shown in FIGS. 1-2. Moreover, the structural piece 120 is configured to connect with the motherboard 600. The connection between the structural piece 120 and the motherboard 600 can be achieved by screws. However, this does not intend to limit the present disclosure. The inlet port 112 and the outlet port 113 of the cold plate 110 are at least partially located within the accommodation space SP. The inlet port 112 and the outlet port 113 of the cold plate 110 at least partially penetrate through the structural piece 120 and the absorbing element 140. It is worth to note that, in this embodiment, the absorbing element 140 is at least partially located between the fourth surface 120b of the structural piece 120 and both of the entrance OP1 of the inlet port 112 and the exit OP2 of the outlet port 113.

In practical applications, a user can use ducts (not shown) to respectively connect with the entrance OP1 and the exit OP2 of the cold plate 110, such that the cooling liquid can flow into or away from the main body 111. For example, the inlet port 112 and the outlet port 113 are respectively configured to be at least partially sleeved by a duct. In practice, the ducts can be respectively sleeved along a portion of the inlet port 112 and a portion of the outlet port 113, such that the entrance OP1 of the inlet port 112 and the exit OP2 of the outlet port 113 are located inside the respective duct, and clips are respectively used to fix the ducts at the inlet port 112 and the outlet port 113. As mentioned above, the absorbing element 140 is at least partially located between the fourth surface 120b of the structural piece 120 and both of the entrance OP1 of the inlet port 112 and the exit OP2 of the outlet port 113. In this way, even if leakage occurs at the connections of the ducts with the entrance OP1 or the exit OP2 due to poor connection, the cooling liquid leaked out can be easily absorbed by the absorbing element 140, such that the cooling liquid leaked out can be avoided from flowing or splashing to other electronic components (not shown) on the motherboard 600, which may cause damage to these electronic components. Afterwards, the cooling liquid absorbed by the absorbing element 140 can be evaporated by the surrounding heat. For example, the absorbing element 140 can be a sponge. However, this does not intend to limit the present disclosure.

In addition, as shown in FIGS. 1-3, the frame 130 has an inner wall 131. The inner wall 131 forms a complete enclosure (please see FIGS. 1-2). This means that the frame 130 completely surrounds the accommodation space SP and the absorbing element 140. Therefore, even if the absorbing element 140 is saturated after absorbing plenty of cooling liquid leaked out and is not able to further absorb any cooling liquid, the excessive cooling liquid will be blocked by the frame 130 and will not easily flow out of the frame 130, which provides a further protection to the other electronic components on the motherboard 600.

Moreover, as shown in FIGS. 1 and 3, the absorbing element 140 at least partially abuts against the inner wall 131 of the frame 130, which facilitates to fix the position of the absorbing element 140 relative to the frame 130. In addition, the absorbing element 140 also at least partially abuts against the inlet port 112 and the outlet port 113 of the cold plate 110.

Figure 4:
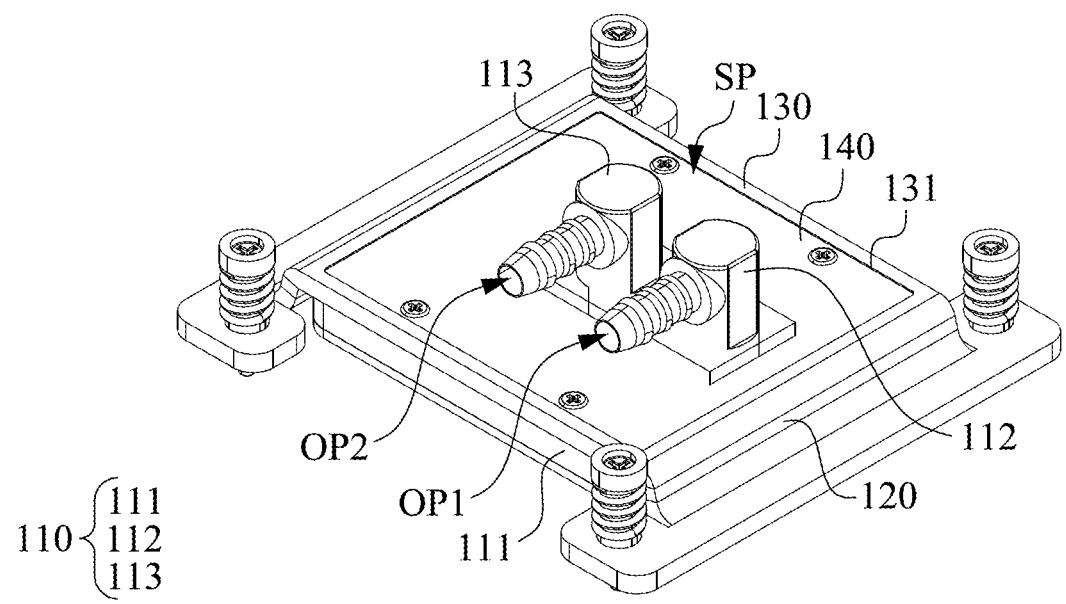
FIG. 4 is a schematic view of a cold plate module according to another embodiment of the present disclosure.
Figure 5:
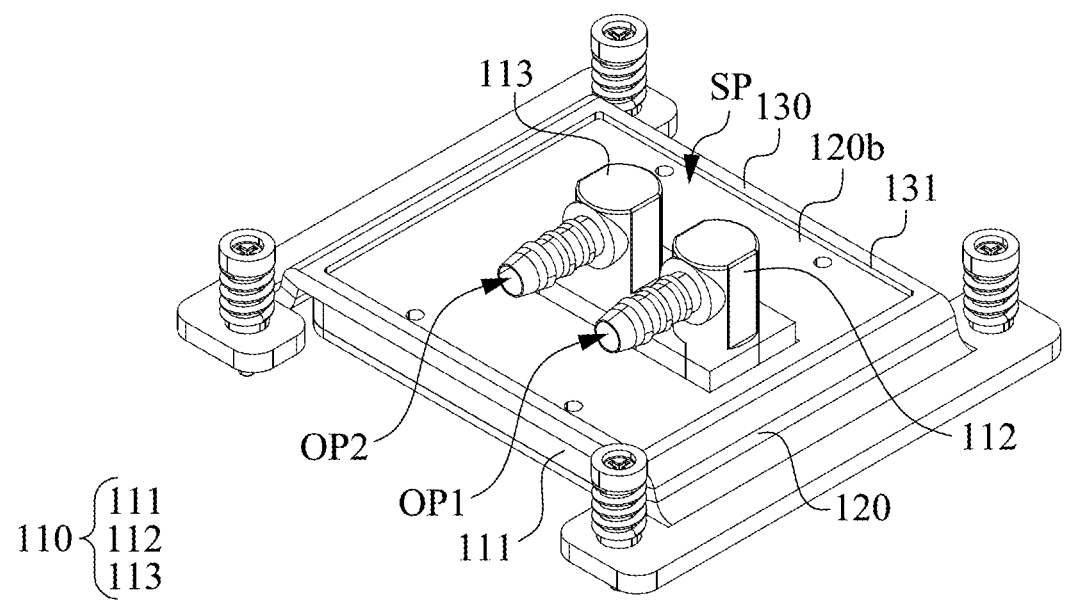
FIG. 5 is a schematic view of the cold plate module of FIG. 4, in which the absorbing element is omitted.

Reference is made to FIGS. 4-5. FIG. 4 is a schematic view of a cold plate module 100 according to another embodiment of the present disclosure. FIG. 5 is a schematic view of the cold plate module 100 of FIG. 4, in which the absorbing element 140 is omitted. In this embodiment, as shown in FIGS. 4-5, the structural piece 120 and the frame 130 are of a single structure integrally-formed from the same piece of material. For example, the portion with a height difference of the integrally-formed structure of the structural piece 120 and the frame 130 can be processed by craft such as milling or molding. However, this does not intend to limit the present disclosure.

Figure 6:
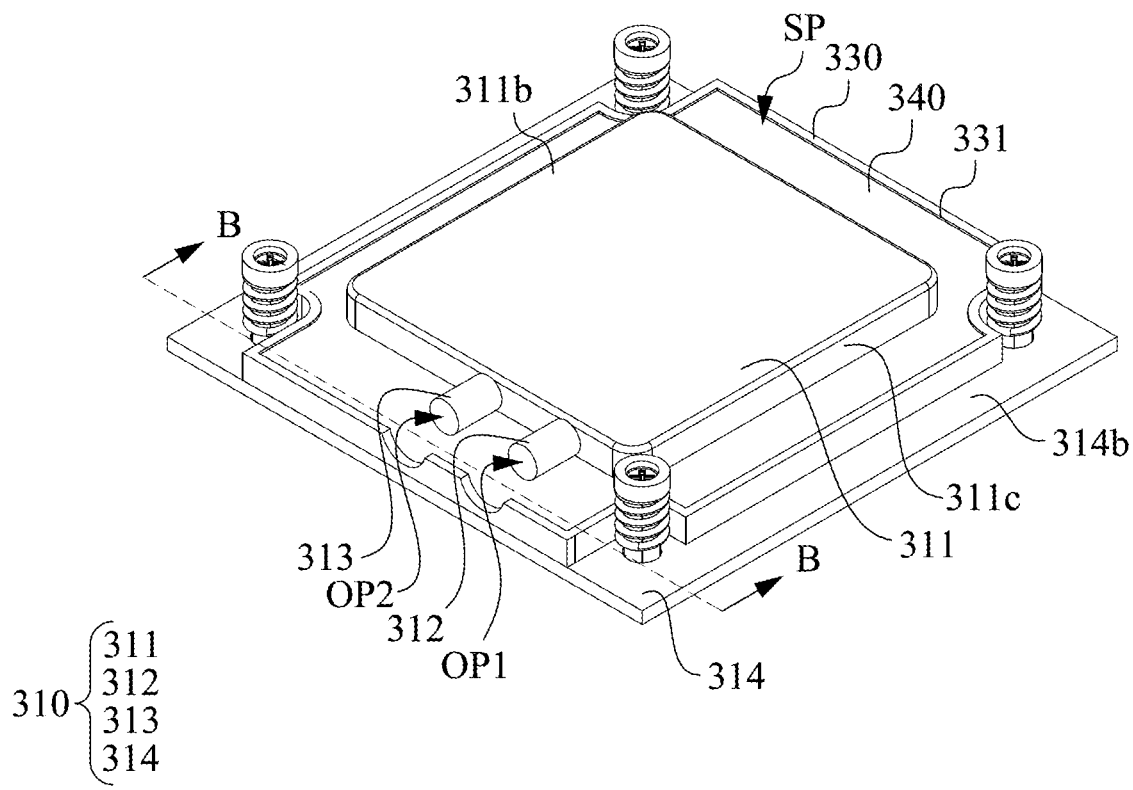
FIG. 6 is a schematic view of a cold plate module according to a further embodiment of the present disclosure.
Figure 7:
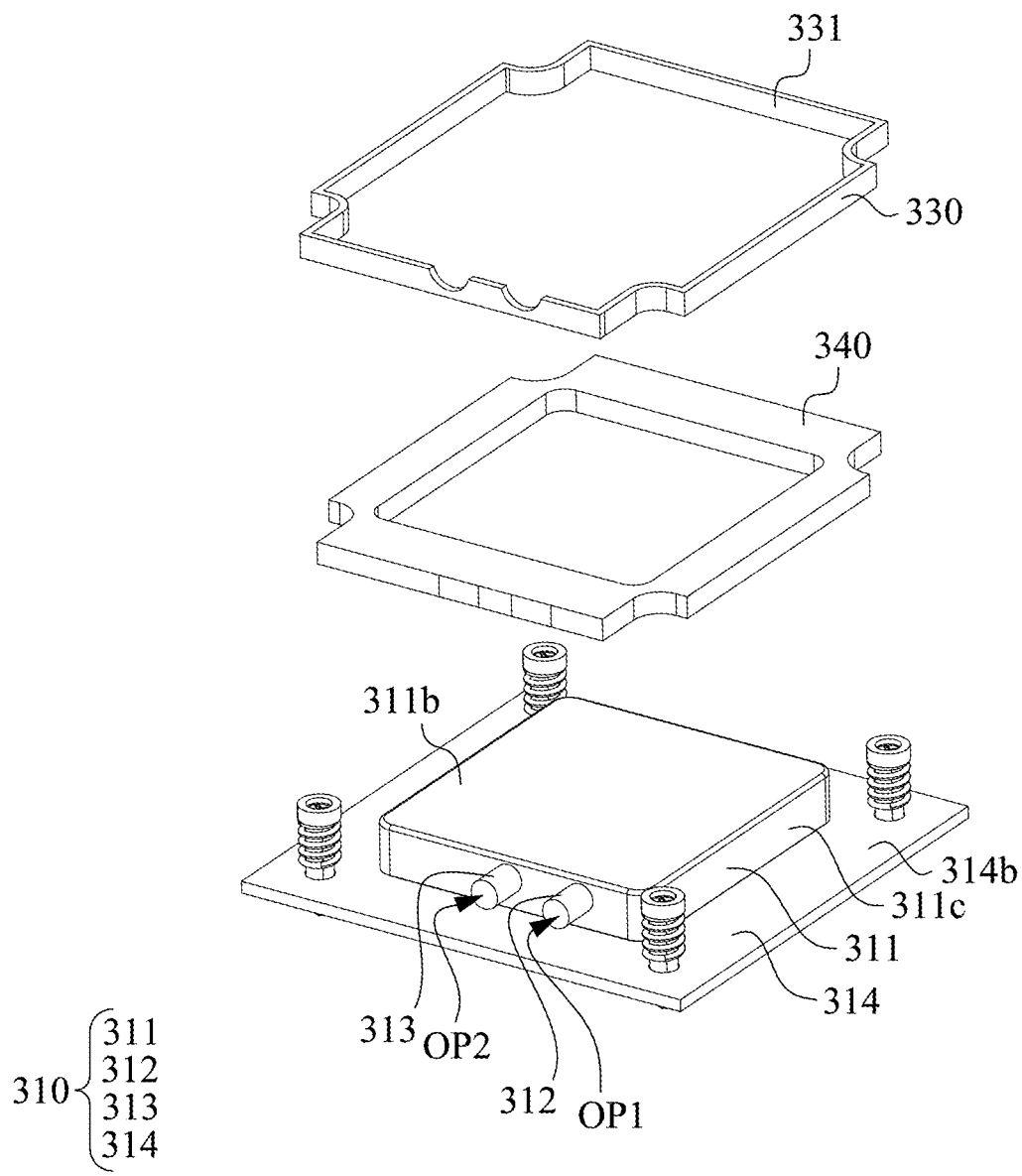
FIG. 7 is an exploded view of the cold plate module of FIG. 6.

Reference is made to FIGS. 6-7. FIG. 6 is a schematic view of a cold plate module 300 according to a further embodiment of the present disclosure. FIG. 7 is an exploded view of the cold plate module 300 of FIG. 6. In this embodiment, as shown in FIGS. 6-7, a cold plate module 300 includes a cold plate 310, a frame 330 and an absorbing element 340. The cold plate 310 includes a main body 311, a structural plate 314, an inlet port 312 and an outlet port 313. The main body 311 has a side surface 311c, a first surface 311a (please see FIG. 8) and a second surface 311b. The first surface 311a and the second surface 311b are opposite to each other. The side surface 311c is connected between the first surface 311a and the second surface 311b. The structural plate 314 is connected with the side surface 311c. The structural plate 314 has a third surface 314a (please see FIG. 8) and a fourth surface 314b opposite to the third surface 314a. The inlet port 312 is connected with the side surface 311c and is communicated with the main body 311. The inlet port 312 has an entrance OP1. The entrance OP1 is configured to allow a cooling liquid to flow into the main body 311. The outlet port 313 is connected with the side surface 311c and is communicated with the main body 311. The outlet port 313 has an exit OP2. The exit OP2 is configured to allow the cooling liquid to flow away from the main body 311. The frame 330 is connected with the fourth surface 314b of the structural plate 314. The frame 330 defines an accommodation space SP together with the fourth surface 314b. The side surface 311c, the inlet port 312 and the outlet port 313 are at least partially located within the accommodation space SP. The absorbing element 340 is connected with the fourth surface 314b of the structural plate 314 and is disposed within the accommodation space SP.

Figure 8:
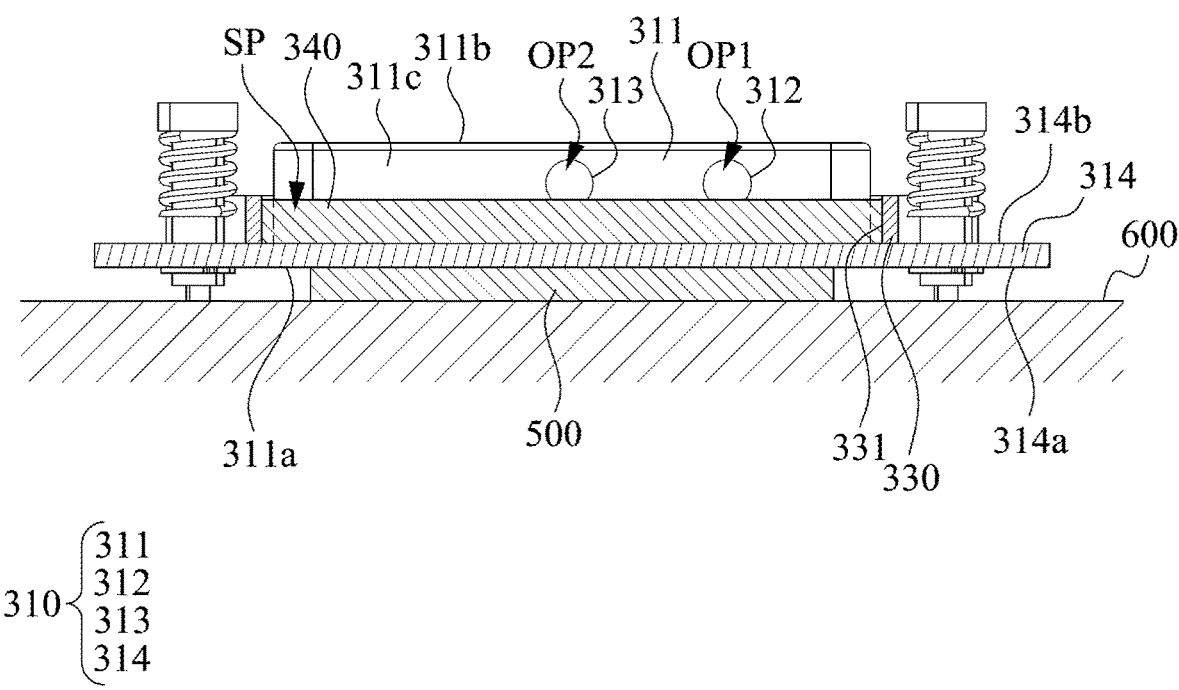
FIG. 8 is a cross-sectional view along the sectional line B-B of FIG. 6.

Reference is made to FIG. 8 together with FIGS. 6-7. FIG. 8 is a cross-sectional view along the sectional line B-B of FIG. 6. In this embodiment, as shown in FIGS. 6-8, the third surface 314a of the structural plate 314 is coplanar with the first surface 311a of the main body 311, and the first surface 311a is configured to abut against a heat source 500, such that the cold plate 310 can deliver any heat of the heat source 500 away, in order to carry out heat dissipation to the heat source 500. For example, the heat source 500 can be a chip or a die, which is disposed on a motherboard 600 of an electronic device. For example, the motherboard 600 can be an application specific integrated circuit (ASIC) board. However, this does not intend to limit the present disclosure. For the sake of drawing simplification, the heat source 500 and the motherboard 600 are not shown in FIGS. 6-7. Moreover, the structural plate 314 is configured to connect with the motherboard 600. The connection between the structural plate 314 and the motherboard 600 can be achieved by screws. However, this does not intend to limit the present disclosure. The inlet port 312 and the outlet port 313 of the cold plate 310 are at least partially located within the accommodation space SP. The main body 311 of the cold plate 310 at least partially penetrates through the absorbing element 340. It is worth to note that, in this embodiment, the absorbing element 340 is at least partially located between the fourth surface 314b of the structural plate 314 and both of the entrance OP1 of the inlet port 312 and the exit OP2 of the outlet port 313.

In practical applications, a user can use ducts (not shown) to respectively connect with the entrance OP1 and the exit OP2 of the cold plate 310, such that the cooling liquid can flow into or away from the main body 311. For example, the inlet port 312 and the outlet port 313 are respectively configured to be at least partially sleeved by a duct. In practice, the ducts can be respectively sleeved along a portion of the inlet port 312 and a portion of the outlet port 313, such that the entrance OP1 of the inlet port 312 and the exit OP2 of the outlet port 313 are located inside the respective duct, and clips are respectively used to fix the ducts at the inlet port 312 and the outlet port 313. As mentioned above, the absorbing element 340 is at least partially located between the fourth surface 314b of the structural plate 314 and both of the entrance OP1 of the inlet port 312 and the exit OP2 of the outlet port 313. In this way, even if leakage occurs at the connections of the ducts with the entrance OP1 or the exit OP2 due to poor connection, the cooling liquid leaked out can be easily absorbed by the absorbing element 340, such that the cooling liquid leaked out can be avoided from flowing or splashing to other electronic components (not shown) on the motherboard 600, which may cause damage to these electronic components. Afterwards, the cooling liquid absorbed by the absorbing element 340 can be evaporated by the surrounding heat. For example, the absorbing element 340 can be a sponge. However, this does not intend to limit the present disclosure.

In addition, as shown in FIGS. 6-8, the frame 330 has an inner wall 331. The inner wall 331 forms a complete enclosure (please see FIGS. 6-7). This means that the frame 330 completely surrounds the accommodation space SP and the absorbing element 340. Therefore, even if the absorbing element 340 is saturated after absorbing plenty of cooling liquid leaked out and is not able to further absorb any cooling liquid, the excessive cooling liquid will be blocked by the frame 330 and will not easily flow out of the frame 330, which provides a further protection to the other electronic components on the motherboard 600.

Moreover, as shown in FIGS. 6 and 8, the absorbing element 340 at least partially abuts against the inner wall 331 of the frame 330, which facilitates to fix the position of the absorbing element 340 relative to the frame 330. In addition, the absorbing element 340 also at least partially abuts against the side surface 311c of the cold plate 310.

Figure 9:
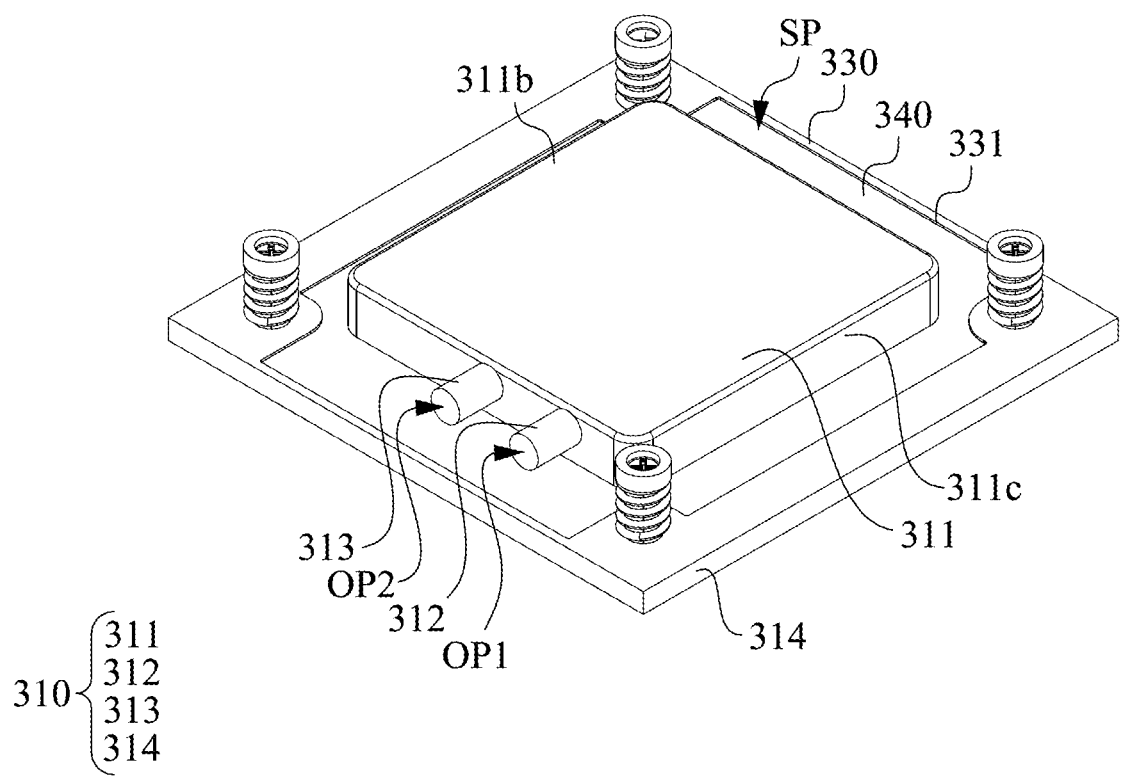
FIG. 9 is a schematic view of a cold plate module according to another embodiment of the present disclosure.
Figure 10:
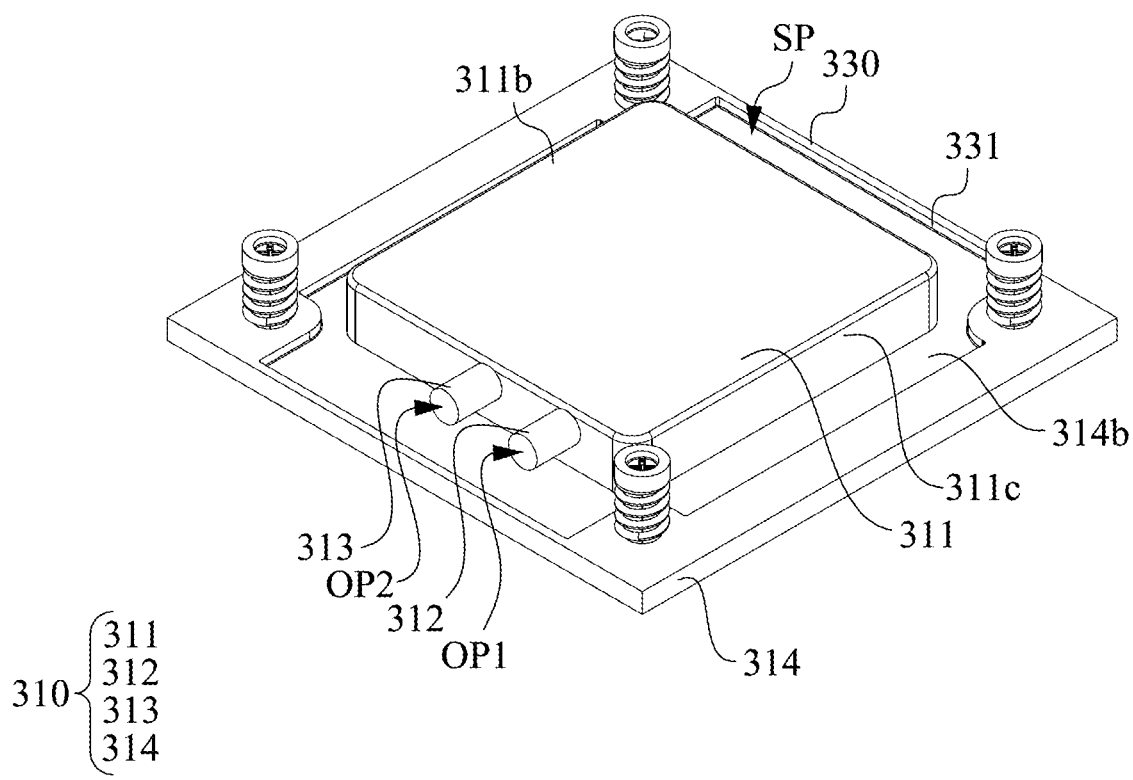
FIG. 10 is a schematic view of the cold plate module of FIG. 9, in which the absorbing element is omitted.

Reference is made to FIGS. 9-10. FIG. 9 is a schematic view of a cold plate module 300 according to another embodiment of the present disclosure. FIG. 10 is a schematic view of the cold plate module 300 of FIG. 9, in which the absorbing element 340 is omitted. In this embodiment, as shown in FIGS. 9-10, the structural plate 314 and the frame 330 are of a single structure integrally-formed from the same piece of material. For example, the portion with a height difference of the integrally-formed structure of the structural plate 314 and the frame 330 can be processed by craft such as milling or molding. However, this does not intend to limit the present disclosure.

In conclusion, the aforementioned embodiments of the present disclosure have at least the following advantages:

(1) Since the absorbing element is at least partially located between the fourth surface of the structural piece or the structural plate and both of the entrance of the inlet port and the exit of the outlet port, even if leakage occurs at the connections of the ducts with the entrance or the exit due to poor connection, the cooling liquid leaked out can be easily absorbed by the absorbing element, such that the cooling liquid leaked out can be avoided from flowing or splashing to other electronic components on the motherboard, which may cause damage to these electronic components.

(2) Since the inner wall of the frame forms a complete enclosure, even if the absorbing element is saturated after absorbing plenty of cooling liquid leaked out and is not able to further absorb any cooling liquid, the excessive cooling liquid will be blocked by the frame and will not easily flow out of the frame, which provides a further protection to the other electronic components on the motherboard.

Although the present disclosure has been described in considerable detail with reference to certain embodiments thereof, other embodiments are possible. Therefore, the spirit and scope of the appended claims should not be limited to the description of the embodiments contained herein.

It will be apparent to the person having ordinary skill in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A cold plate module, comprising:
    a cold plate, comprising:
        a main body having a first surface and a second surface opposite to the first surface, the first surface being configured to abut against a heat source disposed on a motherboard;
        an inlet port connected with the second surface and communicated with the main body, the inlet port having an entrance configured to allow a cooling liquid to flow into the main body; and
        an outlet port connected with the second surface and communicated with the main body, the outlet port having an exit configured to allow the cooling liquid to flow away from the main body;
    a structural piece having a third surface and a fourth surface opposite to the third surface, the third surface being configured to connect with the second surface, the structural piece being configured to connect with the motherboard;
    a frame connected with the fourth surface and defining an accommodation space together with the fourth surface, the inlet port and the outlet port being at least partially located within the accommodation space; and
    an absorbing element connected with the fourth surface and disposed within the accommodation space, the inlet port and the outlet port at least partially penetrating through the structural piece and the absorbing element, the absorbing element being at least partially located between the fourth surface and both of the entrance and the exit.

2. The cold plate module of claim 1, wherein the frame has an inner wall forming a complete enclosure.

3. The cold plate module of claim 2, wherein the absorbing element at least partially abuts against the inner wall.

4. The cold plate module of claim 1, wherein the absorbing element at least partially abuts against the inlet port and the outlet port.

5. The cold plate module of claim 1, wherein the structural piece and the frame are integrally-formed.

6. The cold plate module of claim 1, wherein the absorbing element is a sponge.

7. The cold plate module of claim 1, wherein the inlet port is configured to be at least partially sleeved by a duct such that the entrance is located inside the duct.

8. The cold plate module of claim 1, wherein the outlet port is configured to be at least partially sleeved by a duct such that the exit is located inside the duct.

9. A cold plate module, comprising:
    a cold plate, comprising:
        a main body having a side surface, a first surface and a second surface, the first surface and the second surface being opposite to each other, the side surface being connected between the first surface and the second surface, the first surface being configured to abut against a heat source disposed on a motherboard;
    a structural plate connected with the side surface and having a third surface and a fourth surface opposite to the third surface, the third surface being coplanar with the first surface, the structural plate being configured to connect with the motherboard;

an inlet port connected with the side surface and communicated with the main body, the inlet port having an entrance configured to allow a cooling liquid to flow into the main body; and an outlet port connected with the side surface and communicated with the main body, the outlet port having an exit configured to allow the cooling liquid to flow away from the main body;

a frame connected with the fourth surface and defining an accommodation space together with the fourth surface, the side surface, the inlet port and the outlet port being at least partially located within the accommodation space; and an absorbing element connected with the fourth surface and disposed within the accommodation space, the main body at least partially penetrating through the absorbing element, the absorbing element being at least partially located between the fourth surface and both of the entrance and the exit.

10. The cold plate module of claim 9, wherein the frame has an inner wall forming a complete enclosure.

11. The cold plate module of claim 10, wherein the absorbing element at least partially abuts against the inner wall.

12. The cold plate module of claim 9, wherein the absorbing element at least partially abuts against the side surface.

13. The cold plate module of claim 9, wherein the structural plate and the frame are integrally-formed.

14. The cold plate module of claim 9, wherein the absorbing element is a sponge.

15. The cold plate module of claim 9, wherein the inlet port is configured to be at least partially sleeved by a duct such that the entrance is located inside the duct.

16. The cold plate module of claim 9, wherein the outlet port is configured to be at least partially sleeved by a duct such that the exit is located inside the duct.

* * * * *